United States Patent
Pawlowski et al.

(10) Patent No.: US 8,553,330 B1
(45) Date of Patent: *Oct. 8, 2013

(54) CYLINDRICAL LENS WITH REFRACTIVE OPTICAL ELEMENT AND DIFFRACTIVE OPTICAL ELEMENT

(75) Inventors: Edgar Pawlowski, Stadecken-Elsheim (DE); Matthias Brinkmann, Mainz-Kastel (DE); Wolfram Beier, Essenheim (DE); Jörg Luttmer, Mainz (DE); Bernd Wölfing, Mainz (DE); Polina Ebeling, Heidesheim (DE)

(73) Assignee: Schott AG, Mainz (DE)

( * ) Notice: Subject to any disclaimer, the term of this patent is extended or adjusted under 35 U.S.C. 154(b) by 1279 days.

This patent is subject to a terminal disclaimer.

(21) Appl. No.: 12/017,884

(22) Filed: Jan. 22, 2008

Related U.S. Application Data (63) Continuation of application No. 10/991,574, filed on Nov. 18, 2004, now Pat. No. 7,345,828.

(30) Foreign Application Priority Data

Nov. 21, 2003 (DE) .................................. 103 54 780

(51) Int. Cl.
    *G02B 5/18* (2006.01)
(52) U.S. Cl.
    USPC .............. 359/569; 359/19; 359/668; 372/101
(58) Field of Classification Search
    USPC ........................................................ 359/565
    See application file for complete search history.

(56) References Cited

U.S. PATENT DOCUMENTS

| | | | |
|---|---|---|---|
| 4,519,704 A | | 5/1985 | Mansfield et al. |
| 4,995,685 A | | 2/1991 | Armstrong et al. |
| 5,198,916 A | * | 3/1993 | Kim ................................ 359/15 |
| 5,208,701 A | | 5/1993 | Maeda |
| 5,223,978 A | * | 6/1993 | Burkhart et al. .............. 359/569 |
| 5,229,883 A | | 7/1993 | Jackson et al. |
| 5,486,694 A | * | 1/1996 | Harris ............................ 250/236 |
| 5,526,166 A | | 6/1996 | Genovese |
| 5,694,247 A | * | 12/1997 | Ophey et al. ................... 359/566 |
| 6,075,650 A | * | 6/2000 | Morris et al. .................. 359/641 |
| 6,108,138 A | * | 8/2000 | Ophey et al. ................... 359/711 |

(Continued)

FOREIGN PATENT DOCUMENTS

| | | |
|---|---|---|
| DE | 19500513 | 11/1996 |
| DE | 692 113 198 T2 | 2/1997 |

(Continued)

OTHER PUBLICATIONS

Office Action dated Oct. 18, 2010 corresponding to Korean Patent Application No. 2004-335268.

(Continued)

*Primary Examiner* — Arnel C Lavarias
(74) *Attorney, Agent, or Firm* — Ohlandt, Greeley, Ruggiero & Perle, LLP.

(57) ABSTRACT

A cylindrical lens having a refractive optical element and a diffractive optical element is used in order to provide a cylindrical lens that can preferably be fabricated cost effectively and precisely, and in the case of which optical aberrations and defects in semiconductor diode laser arrangements can be corrected. The diffractive optical element can include various segments.

31 Claims, 3 Drawing Sheets

(56) References Cited

U.S. PATENT DOCUMENTS

| | | | |
|---|---|---|---|
| 6,115,164 A | 9/2000 | Kamikubo | |
| 6,327,110 B1 | 12/2001 | Sano et al. | |
| 6,356,380 B1 * | 3/2002 | Whitney | 359/321 |
| 6,421,178 B1 | 7/2002 | Lissotschenko et al. | |
| 6,856,471 B2 | 2/2005 | Totsuka et al. | |
| 8,062,753 B2 * | 11/2011 | Schreder et al. | 428/426 |
| 2003/0125186 A1 * | 7/2003 | Hayashi et al. | 501/50 |

FOREIGN PATENT DOCUMENTS

| | | |
|---|---|---|
| DE | 198 50 431 A1 | 5/2000 |
| DE | 19846532 | 5/2000 |
| DE | 199 36 328 A1 | 3/2001 |
| DE | 199 39 750 C2 | 8/2001 |
| DE | 100 33 562 A1 | 2/2002 |
| EP | 0 786 838 A2 | 7/1997 |
| EP | 0 872 754 A1 | 10/1998 |
| EP | 0961152 | 7/1999 |
| EP | 1 345 062 A2 | 9/2003 |
| JP | 10253911 | 9/1998 |
| JP | 2001-324691 A | 11/2001 |
| JP | 2001324691 | 11/2001 |
| WO | WO 00/19248 | 4/2000 |
| WO | WO/02082164 | 10/2002 |
| WO | WO/03029156 A1 | 4/2003 |

OTHER PUBLICATIONS

Japanese Office Action dated Apr. 16, 2010 for corresponding Japanese Application No. 2004-335268 (w/ English translation).

* cited by examiner

CYLINDRICAL LENS WITH REFRACTIVE OPTICAL ELEMENT AND DIFFRACTIVE OPTICAL ELEMENT

CROSS REFERENCE TO RELATED APPLICATIONS

This application is continuation application of U.S. application Ser. No. 10/991,574 filed Nov. 18, 2004, which issued as U.S. Pat. No. 7,345,828 on Mar. 18, 2008, which claims the benefit under 35 U.S.C. §119 of German Application No. 103 54 780, filed Nov. 21, 2003, the entire contents of each of which are incorporated by reference herein.

BACKGROUND OF THE INVENTION

1. Field of the Invention

The invention relates to optical lenses and lens systems in general and to cylindrical lenses and cylindrical lens systems such as are used in beam shaping of the light from high power semiconductor diode lasers and corresponding arrays.

2. Description of Related Art

A cylindrical lens is understood as a transparent optically refracting body having at least one bounded free surface. The real or virtual combination point of beams entering in an axially parallel fashion is understood as the focal point.

Devices for beam shaping the light of high power lasers are conventionally constructed in a complicated fashion using multilens refractive systems (for example lens arrays and/or prism arrays): see, for example, DE 195 00 513 or else DE 198 46 532 and EP 0 961 152. These optical systems serve the purpose of carrying out beam shaping by largely retaining the optical quality of the laser diode emitter radiation, in particular of circularizing the beam cone between the so-called fast axis and slow axis.

Furthermore, PCT/EP02/03283 proposes linear prism arrays for correcting the light emanating from a laser array. The aim in this case is to use prisms of respectively different tilt to compensate a lateral offset, known as "smile", of individual lasers in the case of which the respective light exit surface of the individual laser is situated not on a straight line but on a curved line.

Lens arrays and prism arrays are generally difficult to fabricate and have, between the respective prisms, stepped lateral surfaces that are disadvantageous for the propagation of light by reflection. Further multiple prism arrangements are also known from U.S. Pat. No. 6,421,178 B1.

WO 00/19248 describes a biconcave microcylindrical lens system in which at least two aspheric surfaces are to be produced with high accuracy. It is known from the standard textbook "High-Power Diode Lasers" by R. Diehl, Springer (2000), that optical materials of high refractive index (generally >1.7) must be used in conjunction with aspheric surfaces for the purpose of exact fast-axis collimation (residual divergence<5 mrad) of diode laser emitters or emitter arrays by means of purely refractive optics.

Not only is the high outlay on production of aspheric surfaces adjusted relative to one another disadvantageous in such systems, so also is the difficult exact mounting, for example, in the exact alignment relative to a stationary light source. It is proposed here for the purpose of simplifying the mounting to fit spacers that prescribe a defined spacing from a reference plane. However, what is disadvantageous here is that even a slight deviation in the refractive power and/or the dimensional accuracy of the lens owing to the manufacturing tolerances would also respectively require different spacings, and this could be taken into account only with great effort.

BRIEF SUMMARY OF THE INVENTION

It is the object of the invention to specify a cylindrical lens that can preferably be fabricated cost effectively and precisely and in the case of which it is possible to correct aberrations owing to cylinder shape or defects in cylinder shape as well as defects in semiconductor diode laser arrangements.

If the cylindrical lens is designed with a refractive optical element preferably having a planar convex cylindrical surface and with a diffractive optical element, preferably on the planar surface, optical aberrations caused by a spherical convex side geometry and/or low-refractive-index optical materials, since the diffractive optical element can produce a type of pre-correction of the phase front which corresponds to a substantially exact compensation after traversal of the refractively acting lens component. The following algorithms, for example, can be used to determine the required, spatially dependent phase shift, absorption and/or reflection:

Analytical calculating formulas such as are described in standard textbooks (for example J. Turunen, F. Wyrowski, "Diffraction Optics", Academy, 1997), and Numerical optimization methods such as are implemented, for example, in commercial lens design software programs such as Zemax or Code V.

The diffractive optical element can advantageously be arranged in this case on the body of the refractive optical element having a cylindrical surface, or can be defined by said body.

If the diffractive optical element is arranged in a plane opposite the cylindrical surface, it is possible thereby to provide a hybrid, diffractive-refractive lens system that permits the two partial lens systems to be exactly spaced apart. Together with the cylindrical surface, the diffractive element in this case advantageously defines an aspheric cylindrical lens which, within the meaning of this application, is a cylindrical lens that scarcely exhibits optical aberrations, in particular exhibits no spherical aberrations.

In a particularly preferred embodiment, the cylindrical lens is a fast-axis collimator lens assigned to at least one semiconductor laser. In a further inventive refinement, the cylindrical lens is assigned to a preferably linear array of semiconductor diode lasers, in particular an array of high power diode lasers.

If the cylindrical lens has at least one defined curvature in its optical and/or physical longitudinal direction, it is possible thereby for defects in the diode laser array to be compensated in a defined fashion preferably related to tolerance range.

If the cylindrical lens comprises a further functional element, substantial advantages can be achieved thereby.

For example, it is possible for a predefined portion of the light of a high power laser to be directed onto a monitor diode.

When use is made of diode laser arrays, it is advantageously possible for a portion of the light to be reflected and focused into individual laser waveguides that serve as monitor diodes.

Furthermore, a further functional element can produce an image, preferably a far field image, that permits the cylindrical lens to be aligned, preferably while being mounted, relative to a light source and/or an external pattern.

If the further functional element is a diffractive optical element that is suitable for aiming light onto a detector as a function of the position of the cylindrical lens relative to a light source, the intensity signal obtained with the detector can be used for the adjustment instead of or in addition to the imaging. Four quadrant detector is advantageous in this case as spatially resolving optical detector.

It is, furthermore, advantageous when the additional optical element is a diffractive optical element by means of which it is possible to image and/or read out an identification. It is possible thereby to identify or code manufacture information, material properties, tolerance classes, longitudinal flexure classes, or product numbers.

As part of a multilens collimator system, the further diffractive element is capable, furthermore, of cost effectively having a focusing or prefocusing effect.

When the further diffractive element defines a further cylindrical lens whose optical longitudinal axis extends substantially transverse to the optical longitudinal axis of the cylindrical lens, independent focusing and/or error compensation can be performed in two directions preferably running perpendicular to one another. It is advantageous in this case when as slow-axis collimator lens or part of a slow-axis collimator lens system, the further diffractive element has a focusing or prefocusing effect, preferably transverse to the optical longitudinal axis of the cylindrical lens.

It can be advantageous to arrange the diffractive and refractive components substantially tilted relative to the optical longitudinal axis, in order to achieve independent focusing and/or error compensation in a number of directions. It is advantageous in this case to erase the individual elements in a segmented fashion, at least one segment being assigned to a laser emitter. The partial beams produced improve the uniform illumination of the overall aperture and reduce the reflection of light from the component surfaces into the laser emitters.

Given an antireflection layer, in particular an antireflection layer the effect of which is to reduce reflection by diffraction, for example a moth eye antireflection layer that is preferably designed as part of a diffractively acting layer of the cylindrical lens, it is possible to produce both the diffractive element and the antireflection layer in essentially one production step.

BRIEF DESCRIPTION OF THE SEVERAL VIEWS OF THE DRAWINGS

The invention is described below in more detail with the aid of preferred embodiments and with reference to the attached drawings, in which.

DETAILED DESCRIPTION OF THE INVENTION

It may be firstly stated in the following detailed description of the individual embodiments preferred according to the invention that the attached drawings are merely of an explanatory nature and do not necessarily show actual embodiments in illustrations of correct scale.

It may further be pointed out that the term "optical longitudinal axis of a cylindrical lens" that is used in the present disclosure is not restricted to physical geometric dimensions of said lens.

In the case of conventional, purely refractive cylindrical lenses or cylindrical lens systems, this term Lr is intended to denote that axis which extends in the principal optical plane of the cylindrical lens parallel to the spatial physical longitudinal axis of this lens and cuts a principal beam path that advances essentially unbroken through the cylindrical lens and thereby cuts a focal beam that passes through the middle of the cylindrical lens.

In the case of a purely diffractive cylindrical lens, as well, there exists such a longitudinal axis Ld that extends substantially parallel to a focal line of this cylindrical lens and likewise runs in the principal plane of this diffractive lens.

A possible determination of the lateral position of Ld, Ld2, substantially perpendicular to the direction of propagation of a parallel beam bundle or a plane wavefront can be undertaken by determining the position of the axis of symmetry of the diffraction pattern and assigning this lateral position to the axis of symmetry of the optical longitudinal axis of the diffractive cylindrical lens. As in the case of the refractive lens, in geometric optical transmission the lateral position of the optical longitudinal axis Ld, Ld2 of the diffractive lens results as the point of intersection of the optical longitudinal axis with an optical principal beam.

Figure 1:
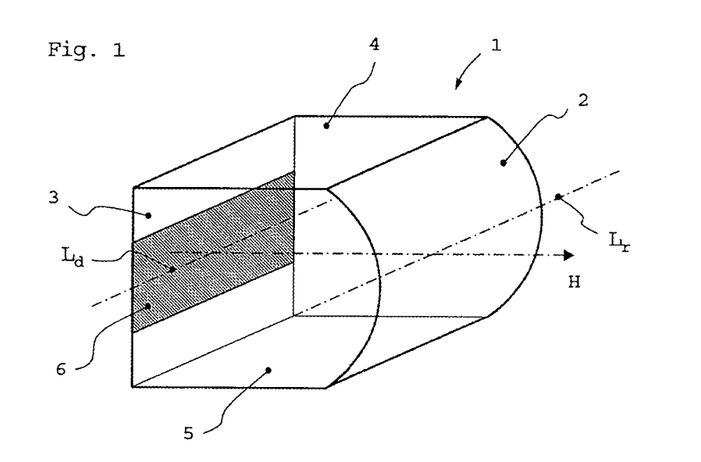
FIG. 1 shows a first preferred embodiment of a cylindrical lens having a refractive and a diffractive optical element, in a diagrammatic, perspective illustration.

Reference is made below to FIG. 1, in which a first preferred embodiment of an inventive cylindrical lens, provided overall with the reference 1, is illustrated.

The cylindrical lens 1 comprises a spherical or a parabolic quasi-cylindrical surface 2 approximating the shape of the cylinder, and a substantially planar surface 3 that extends substantially perpendicular to the upper and lower, preferably planar surfaces 4 and 5.

The cylindrical lens can consist of silica glass, and of all customary types of inorganic optical glasses, as well as of plastics that can be used optically, such as: polymethyl methacrylate, polymethyl methacrylimide, polystyrene, polystyrene-co-acrylonitrile), polycarbonate (including in high-temperature-resistant variants), cycloolefin copolymer, cycloolefin polymer, methylpentene copolymer, polyethylene terephthalate.

The material of the cylindrical lens can be of highly transparent or semitransparent design, and in addition to glass or plastic can also consist of a semiconductor material such as, for example, germanium, CaF, GaP, ZnSe or silicon for shaping the beam and/or wavefront in the infrared region, as is preferred for $CO_2$ material processing lasers. The known material processing methods such as, for example, grinding and lithographic surface processing are available for this purpose.

Arranged on the planar surface 3 is a diffractive optical element 6 that can be formed in the planar surface 3 or be applied thereto.

When use is made of hot shaping materials, this diffractive optical element can be produced by hot pressing, hot embossing, fine embossing and/or by a method denoted as redrawing, in the case of which a molded part which has geometric dimensions of similar shape in space but is larger by far is drawn in its longitudinal direction in a fashion maintaining its structure, and is thereby reduced in the transverse direction.

A particularly preferred method is described in PCT-EP02/10960, and its disclosure is incorporated in full into the present application by reference.

Such a method is particularly advantageous when the diffractive optical element 6 constitutes a diffractive cylindrical lens that lies in the optical longitudinal direction, a direction that runs substantially parallel to the line Ld illustrated in FIG. 1, and lies substantially in the same plane as the principal optical beam H, which passes through the cylindrical lens 1 substantially without being broken and without being diffracted.

The optical longitudinal axis Ld preferably lies in the same plane as the optical longitudinal axis Lr of the refractive element 2.

Furthermore, the diffractive optical element 6 can consist of a photostructurable polymer or else of a photoemulsion that is applied to the planar surface 3 and is structured by means of lithographic techniques known to the person skilled in the art in such a way as to produce an elevation relief that effects the desired local phase shift of a wavefront arrangement advancing into the direction of the principal beam H.

Although less favorable according to the invention, it is also possible to produce a diffraction pattern having the desired optical properties by absorption, for example on developed silver halide crystals.

It is also within the scope of the invention, moreover, to use reflecting, locally structured layers such as, for example, lithographically processed chrome layers that can also be used in addition to a phase modulating depth structure, in order in retroreflection to direct light onto a downstream detector 7, 8 or 9 that is, for example, illustrated in FIG. 3 and described in further detail below.

Figure 3:
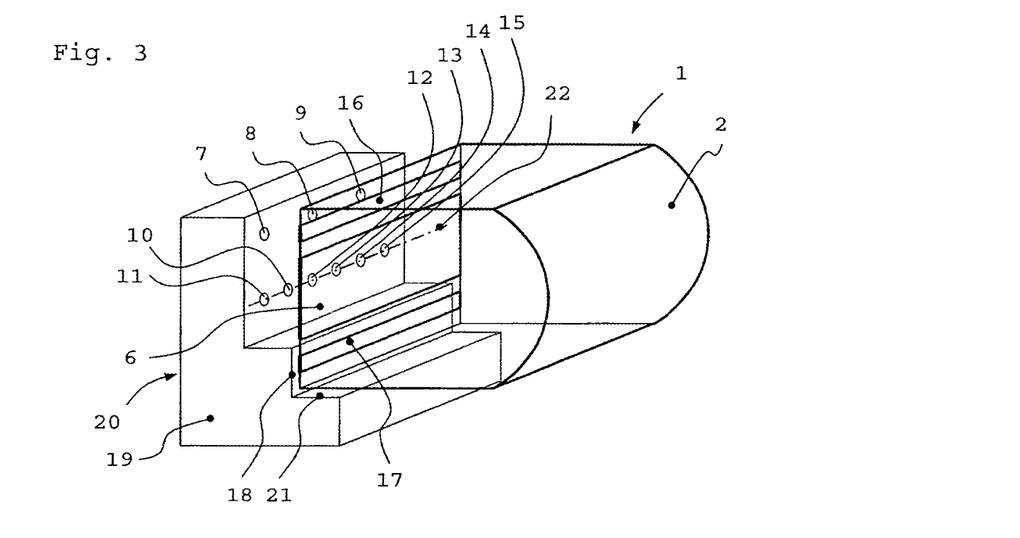
FIG. 3 shows a further preferred embodiment, in the case of which the cylindrical lens illustrated in FIG. 2 is arranged on a linear array of high power semiconductor diode lasers, in a diagrammatic, perspective illustration.

In a particularly preferred embodiment for use, for example, as a fast-axis collimator lens of a semiconductor diode high power laser such as is illustrated by way of example in FIG. 3 with reference numerals 10 to 15, the diffractive element 6 defines an aspheric cylindrical lens together with the refractive element 2, in particular with the spherical surface thereof.

In a fashion similar to the case of rotationally symmetrical aspheres, the present description denotes as an aspheric cylindrical lens in a transferred sense a lens arrangement that is capable of correcting aberrations or at least of measurably reducing them.

On the basis of the small spectral width of the light of the diode lasers 10 to 15, in the preferred embodiment according to the invention, the diffractive element 6 corrects optical aberrations in such a way that non-central regions of the cylindrical lens also act correctly when imaging or when shaping a beam or wavefront, which means that even non-central beam paths parallel to the optical axis are combined in substantially a single focal line.

Figure 4:
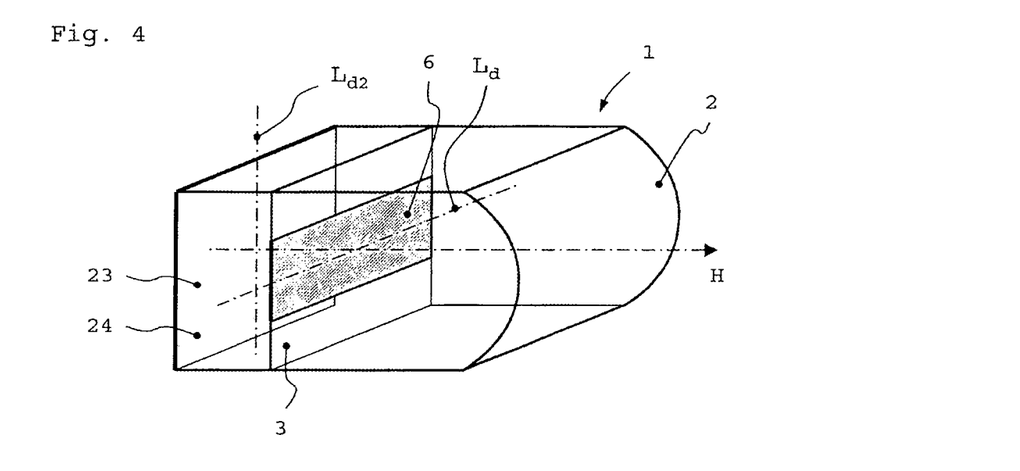
FIG. 4 shows yet a further preferred inventive illustration of a cylindrical lens doublet arrangement that can be used both as a fast-axis collimator arrangement and a slow-axis collimator arrangement.

Moreover, in a further refinement of the invention it is also possible for chromatic errors to be corrected by superimposed diffraction patterns inside the diffractive optical element 6, or by multilens arrangements such as are illustrated, for example in FIG. 4.

Figure 2:
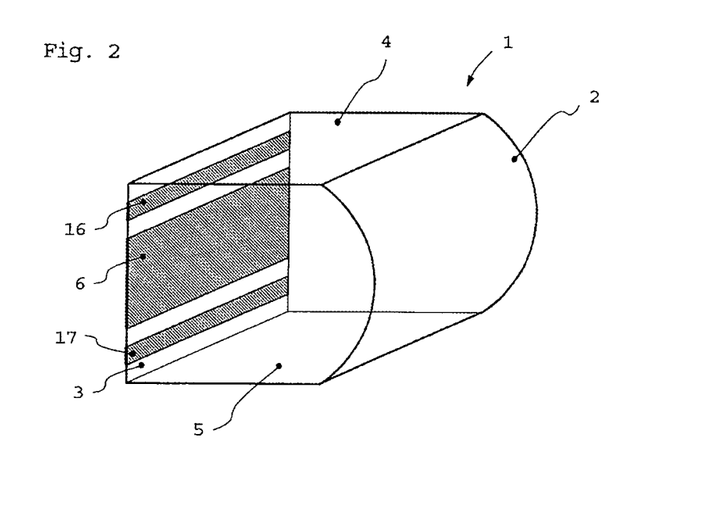
FIG. 2 shows a second preferred embodiment of a cylindrical lens having a refractive and a diffractive optical element, in which a further functional element is present, in a diagrammatic, perspective illustration.

Reference is made below to FIG. 2, in which a second preferred inventive embodiment of a cylindrical lens 1 having a refractive optical element 2 and a diffractive optical element 6 is shown schematically in a perspective illustration.

The lens illustrated in FIG. 2 corresponds substantially to that shown in FIG. 1, but additionally has at least one further functional element 16, 17.

The functional element 16 and the functional element 17 are preferably arranged on the planar surface 3, but can also be formed on the upper surface 4 or the lower surface 5, preferably on an edge region, of the cylindrical surface 2.

The further functional element 16, 17 is preferably suitable for aiming a portion of the light from, for example, one of the high power diode lasers 10 to 15 onto one or more of the detectors 7, 8, 9 (see FIG. 3).

It is preferred in this case to use scattered radiation from the respective laser 10 to 15 in order, by means of a sharply focused point of light or another suitable pattern, to create a criterion for the correct positioning of the cylindrical lens 1 relative to further optical elements or to the high power diode lasers 10 to 15 themselves.

Further preferred patterns can be strip-shaped or grid-shaped interference patterns or Moiré structures, preferably with a nonconstant grid period.

It is possible in this way to establish fluctuations in intensity with the aid of the optical detectors 7, 8, 9 and to assign them to a correct positioning of cylindrical lens 1. When use is made of punctiform patterns, the detectors 7, 8, 9 can be multiquadrant detectors that supply spatially resolved positional data.

As in further preferred inventive embodiment illustrated schematically in perspective in FIG. 3, for example, the further functional element 17 can furthermore contain information either directly or in coded form.

This information can specify the current data of the cylindrical lens 1 such as, for example, actual focal lengths, effective refractive powers of the optical elements 2, 6, or radii of curvature of the optical longitudinal axes Lr, Ld, in order in this way to retrievably provide exact information for the further use of the optical system.

The further functional element 17 can, moreover, contain holographic optical information that produces relevant information pictorially in retroreflection in a defined image plane.

In yet a further preferred embodiment, the further functional element 17 can include geometric structures in space, for example in the form of superimposed Moiré structures together with spatial information that are arranged on the surface 18 of the support body 19 of the high power diode laser array denoted overall by 20.

Otherwise than illustrated in FIG. 3, it is also possible for the cylindrical lens 1 to rest in addition or alternatively on the stepped surface 21 in order in such a way to use the mechanical precision of the fabrication of the support body 19 for lateral adjustment.

In a particularly preferred embodiment, the further functional element 16 has diffractive positive lenses that image in a punctiform fashion and can, for example, lead the light from the laser 11 into the laser 10 by retroreflection.

If only the laser 11 is operated and the diode laser 10 is used as monitor diode during mounting, the correct position can be detected from the intensity of the retroreflected light.

It is also in the scope of the invention for the light from a number of semiconductor lasers to be coupled back during mounting into various semiconductor lasers operated as monitor diodes, in order in this way to assist or to simplify the adjustment.

In this, last named embodiment, it is expedient after the mounting for the further functional element 16 to be covered opaquely or removed.

It is also within the scope of the invention for the further functional element 16 to be designed such that in conjunction with the use of the optical detectors 7, 8 or 9 only in each case the light from a diode laser 10 to 15 or from a defined group of diode lasers is led in a spatially resolved fashion onto in each case one optical detector 7, 8, 9.

It is thereby possible for the output intensity of the respective laser or the respectively assigned group of lasers to be monitored even after mounting and correct adjustment.

It is also within the scope of the invention for the further functional element 16 to be designed such that the latter includes diffraction structures that, in the fundamental mode of the laser, preferably guide light onto a specific optical detector, for example 8.

In the manner of a hologram with a number of directionally resolved images, this diffracting structure can guide light into another optical detector, for example 7 or 9, whenever higher modes build up in the lasers 10 to 15.

It is possible in this way for the mode profile, which can be very useful for strongly focusing systems, to be monitored in real time during operation of the high power lasers 10 to 15.

It is also in the scope of the invention to use an optical detector, for example 7, to monitor the overall intensity of the output radiation of the semiconductor diode lasers 10 to 15, the further functional element 16 leading a defined portion of the light from each high power laser 10 to 15 into the optical detector 7, and it being possible at the same time for the above-described mode monitoring to be carried out by the optical detectors 8 and 9.

During the operation of the high power array 20, it can happen for reasons of production and owing to thermal stresses that the lasers 10 to 15 are not arranged on a straight line such as is indicated, for example, by the dashed and dotted line 22, but that this line 22 running through the center of exit surface of the lasers 10 to 15 exhibits a curvature.

In order to compensate this curvature, the diffractive element 6 and/or the refractive element 2 can likewise exhibit a curved optical longitudinal axis Ld, Lr.

In a particularly preferred way, the diffractive optical element 6 can undertake tolerance range compensation. In this process, from a set of cylindrical lenses 1 with typical radii of curvature of the optical longitudinal axis Ld and/or Lr, a cylindrical lens 1 that comes next and has a corresponding curvature is assigned to a curved laser center line 22 such that this curvature is compensated, or at least reduced, in predefined tolerance classes.

Reference is made below to FIG. 4, which shows a multilens cylindrical lens arrangement 1 where in addition to the refractive optical element 2 and the diffractive optical element 6 there is a further diffractive element 23.

Purely by way of example, this element 23 is formed on a surface 24 that extends spaced apart from and parallel to the surface 3.

The further diffractive element 23 can likewise be arranged on the cylindrical surface of the diffractive element 2 or in a plane 24 inclined thereto.

In a particularly preferred embodiment, substantial simplifications in production can be achieved by means of the further diffractive element 23.

If, for example, the diffractive optical element 23 is designed such that only structures parallel to its optical longitudinal direction Ld are defined, the further diffractive optical element 23 can then, for example, include structures that are substantially symmetrical relative to a second optical longitudinal direction Ld2 that preferably runs perpendicular to the optical longitudinal direction Ld in the plane of the surface 24.

In this case, both the diffractive optical element 6 and the diffractive optical element 23 can each be produced cost effectively and with high precision by means of the method described in PCT EP02/10960.

It is thereby possible to use the further diffractive optical element 23 to provide a cylindrical lens with an optical longitudinal direction Ld2 perpendicular to the optical longitudinal direction Ld which, for example, effects a slow-axis collimation or precollimation. It is possible to undertake appropriate focusing or prefocusing and to avoid higher absorption by longer light propagation paths in the material of the cylindrical lens 1 with the aid of this arrangement even very close to the light exit surface of the respective lasers 10 to 15.

Furthermore, each diode laser 10 to 15 can be assigned a further optical element in a spatially resolved fashion by means of the further optical element 23 in order, for example, to couple light back in the way described above onto one or more of the optical detectors 7, 8, 9.

In a further inventive refinement, the diffractive optical element 23 can also be used in addition or as an alternative to correct acylindrically faults in cylindrical shape that occur only in a downstream imaging system, for example parallel to the optical longitudinal axis Ld2.

The independent compensation of these faults in cylindrical shape in at least two perpendicular directions parallel to Ld and Ld2 permits large degrees of freedom in the correction.

The further diffractive element 23 can also act as a prism for compensating a tilted beam path, for example in order to aim the light of one or more of the lasers 10 to 15 more strongly in a direction parallel or antiparallel to the optical longitudinal axis Ld. There is no occurrence in this case of the disadvantageous stair steps, known from the prior art, between the individual prisms.

The above-described diffractive optical elements 6, 16, 17, 23 can be produced as binary, and therefore digital phase-shifting and/or absorbing and/or reflecting surface patterns.

It is also within the scope of the invention to apply to the surfaces 2, 3 and/or 24, in particular, antireflection layers that act, for example, as moth eye antireflection layers and can be applied at the same time as the diffractive structure.

In addition to the above-described production methods of the cylindrical lens by means of pressing, embossing or fine embossing as well as lithographic and photographic techniques, at least the body of the refractive optical element 2 can be produced very advantageously by means of a further type of hot shaping.

Figure 5:
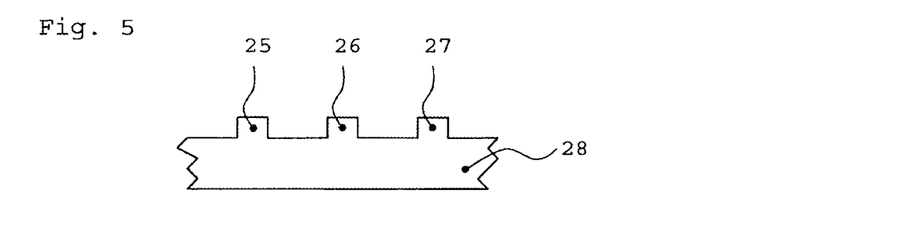
FIG. 5 shows a profile arrangement of a thermally processable transparent substance, preferably consisting of glass or quartz glass.
Figure 6:
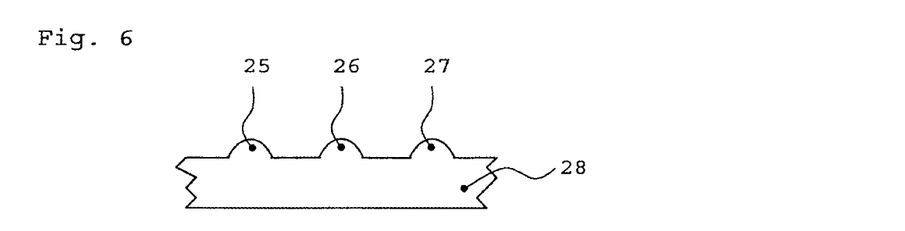
FIG. 6 shows the arrangement from FIG. 5 after thermal processing and change of shape essentially by gravitational force and surface stresses.

In this process, a body 28 that is provided with substantially rectangular elevations 25, 26, 27, consists of thermally deformable material and is shown in a schematic cross-sectional illustration in FIG. 5 is subjected to heating.

This body 28 can consist of glass or a thermally deformable plastic such as has been described above by way of example.

Owing to surface tension and the dead weight of the now viscous elevations 25, 26, 27, the heating can produce a cylindrical or parabolic surface rounding that can be used as surface 2 of the refractive element after separation.

Figure 7:
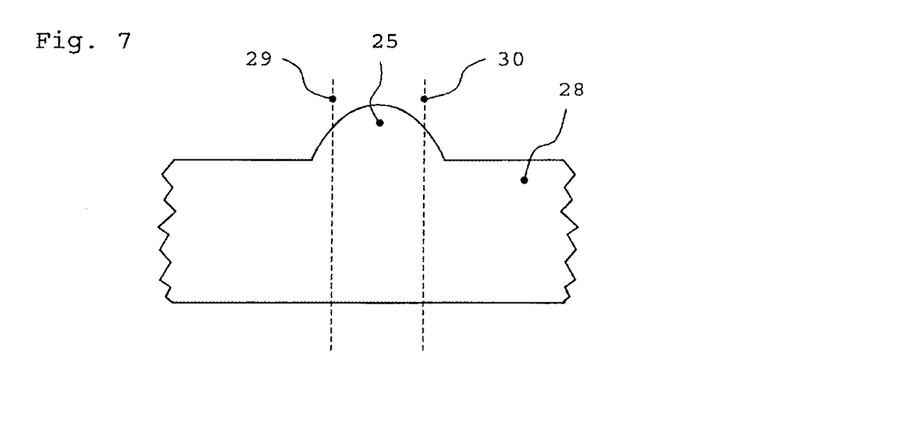
FIG. 7 shows a detail from FIG. 6 with dividing lines at the locations of a later separation of the cylindrical lens arrangement illustrated.

For the purpose of subsequent separation, the rounded elevation 25 can be separated at the separating lines 29 and 30 by, for example, sawing, splitting or grinding, the result being to provide a high precision cylindrical lens production method suitable for mass production.

The above-described cylindrical lenses and multilens arrangements of cylindrical lenses are used in semiconductor laser systems, in particular in high power semiconductor laser systems for material processing.

The design of such a material processing system is likewise within the scope of the invention.

What is claimed is:

1. A cylindrical lens comprising:
   a refractive optical element with a spherical surface;
   a diffractive optical element; and
   a further functional element, wherein said diffractive optical element together with said spherical surface define an aspheric cylindrical lens and said further functional element produces an image that permits said cylindrical lens to be aligned relative to at least one of a light source and an external pattern.

2. The cylindrical lens as claimed in claim 1, wherein said diffractive optical element has a spherical surface or aspherical surface.

3. The cylindrical lens as claimed in claim 1, wherein at least one of the refractive optical element and the diffractive optical element are not perpendicular to an optical axis of the cylindrical lens.

4. The cylindrical lens as claimed in claim 1, wherein the diffractive optical element is arranged in a plane opposite a refractive surface of the cylindrical lens.

5. The cylindrical lens as claimed in claim 1, wherein the diffractive optical element comprises at least one diffractive optical element arranged on the body of the refractive optical element or defined by the body of the refractive optical element, and wherein the diffractive optical element is arranged in a plane opposite a refractive surface of the cylindrical lens.

6. The cylindrical lens as claimed in claim 1, wherein the cylindrical lens is a fast-axis collimator lens assigned to at least one semiconductor laser.

7. The cylindrical lens as claimed in claim 1, wherein the cylindrical lens is assigned to a linear array of semiconductor diode lasers.

8. The cylindrical lens as claimed in claim 1, wherein the cylindrical lens is assigned to an array of high power diode lasers.

9. The cylindrical lens as claimed in claim 1, wherein the further functional element is suitable for directing a predefined portion of light of a high power laser onto a monitor diode or a monitor camera.

10. The cylindrical lens as claimed in claim 1, wherein the further functional element is suitable for directing a predefined portion of light of a high power laser by reflection into one or more laser waveguides of a laser bar that serves only as monitor diode.

11. The cylindrical lens as claimed in claim 1, wherein the further functional element produces a far field image that permits the cylindrical lens to be aligned relative to at least one of a light source and an external pattern.

12. The cylindrical lens as claimed in claim 1, wherein the further functional element is a further diffractive optical element that is suitable for aiming light onto a detector as a function of a position of the cylindrical lens relative to a light source.

13. The cylindrical lens as claimed in claim 1, wherein the further functional element images a structure by means of which an adjustment or relative position of the cylindrical lens relative to a light source can be detected.

14. The cylindrical lens as claimed in claim 1, wherein the further functional element images a structure by means of which an adjustment or relative position of the cylindrical lens relative to a semiconductor diode laser can be detected.

15. The cylindrical lens as claimed in claim 1, wherein the further functional element images a structure by means of which an adjustment or relative position of the cylindrical lens relative to further optical elements can be detected.

16. The cylindrical lens as claimed in claim 1, further comprising a further diffractive element for producing a multilens imaging system.

17. The cylindrical lens as claimed in claim 16, wherein, as part of a multilens collimator system, the further diffractive element has a prefocusing effect.

18. The cylindrical lens as claimed in claim 16, wherein at least one of the diffractive optical element and the further diffractive element are produced by lithography.

19. The cylindrical lens as claimed in claim 1, further comprising one further optical element assigned to a high power laser diode of a linear high power laser diode array.

20. The cylindrical lens as claimed in claim 1, further comprising an antireflection layer that reduces reflection by diffraction.

21. The cylindrical lens as claimed in claim 1, wherein at least the refractive optical element of the cylindrical lens is produced by hot shaping in such a way that a body with rectangular elevations is heated and is left to cool down or is cooled down after being rounded by the action of surface stresses.

22. A lens system comprising the cylindrical lens as claimed in claim 1.

23. A semiconductor laser system comprising the cylindrical lens as claimed claim 1.

24. A material processing system comprising the cylindrical lens as claimed in claim 1.

25. A cylindrical lens comprising:
   a refractive optical element with a spherical surface;
   a diffractive optical element, wherein said diffractive optical element together with said spherical surface define an aspheric cylindrical lens; and
   a further diffractive element for producing a multilens imaging system, wherein the further diffractive element provides the cylindrical lens with a curved optical longitudinal axis.

26. The cylindrical lens as claimed in claim 25, wherein, as slow-axis collimator lens or part of a slow-axis collimator lens system, the further diffractive element has a focusing or prefocusing effect transverse to an optical longitudinal axis of the cylindrical lens.

27. The cylindrical lens as claimed in claim 25, wherein, as slow-axis collimator lens or part of a slow-axis collimator lens system, the further diffractive element has a focusing or prefocusing effect in a tilted fashion in pairs relative to an optical longitudinal axis of the cylindrical lens.

28. The cylindrical lens as claimed in claim 27, wherein the diffractive optical element is a refractive element in addition to the slow-axis collimation.

29. The cylindrical lens as claimed in claim 27, wherein the diffractive and/or refractive optical elements are segmented and tilted such that partial beams bounded by individual segments have different angles.

30. A cylindrical lens comprising:
   a refractive optical element with a spherical surface;
   a diffractive optical element, wherein said diffractive optical element together with said spherical surface define an aspheric cylindrical lens; and
   a further diffractive element for producing a multilens imaging system, wherein the further diffractive element defines a further cylindrical lens whose optical longitudinal axis extends substantially transverse to an optical longitudinal axis of the cylindrical lens.

31. A cylindrical lens comprising:
   a refractive optical element with a spherical surface;
   a diffractive optical element; and a further functional element, wherein said diffractive optical element together with said spherical surface define an aspheric cylindrical lens, and wherein the further functional element has a property selected from the group consisting of: (i) being suitable for directing a predefined portion of light of a high power laser by reflection into one or more laser waveguides of a laser bar that serves only as monitor diode, (ii) producing a far field image that permits the cylindrical lens to be aligned relative to at least one of a light source and an external pattern, (iii) being suitable for aiming light onto a detector as a function of a position of the cylindrical lens relative to a light source, (iv) imaging a structure by means of which an adjustment or relative position of the cylindrical lens relative to a light source can be detected, (v) imaging a structure by means of which an adjustment or relative position of the cylindrical lens relative to a semiconductor diode laser can be detected, and (vi) imaging a structure by means of which an adjustment or relative position of the cylindrical lens relative to further optical elements can be detected.

* * * * *